United States Patent

Xie et al.

[11] Patent Number: 5,989,737
[45] Date of Patent: Nov. 23, 1999

[54] ORGANIC ELECTROLUMINESCENT DEVICES

[75] Inventors: Shuang Xie, Mississauga; Nan-Xing Hu, Oakville; Zoran D. Popovic, Mississauga; Ah-Mee Hor, Mississauga; Beng S. Ong, Mississauga, all of Canada

[73] Assignee: Xerox Corporation, Stamford, Conn.

[21] Appl. No.: 08/807,489

[22] Filed: Feb. 27, 1997

[51] Int. Cl.⁶ .................................................. H05B 33/12
[52] U.S. Cl. ............................ 428/690; 428/704; 428/917; 428/213; 428/332; 428/457; 313/502; 313/503; 313/504; 313/506
[58] Field of Search ...................................... 428/690, 704, 428/917, 457, 332, 213; 313/502, 503, 504, 506

[56] References Cited

U.S. PATENT DOCUMENTS

| | | |
|---|---|---|
| 4,356,429 | 10/1982 | Tang .......................................... 313/503 |
| 4,539,507 | 9/1985 | VanSlyke et al. ........................ 313/504 |
| 4,769,292 | 9/1988 | Tang et al. ................................ 428/690 |
| 4,950,950 | 8/1990 | Perry et al. ................................ 313/504 |
| 5,150,006 | 9/1992 | VanSlyke et al. ........................ 313/504 |
| 5,281,489 | 1/1994 | Mori et al. ................................. 428/690 |
| 5,503,910 | 4/1996 | Matsuura et al. ......................... 428/212 |
| 5,540,999 | 7/1996 | Yamamoto et al. .................... 428/411.1 |
| 5,601,903 | 2/1997 | Fujii et al. ................................. 428/212 |
| 5,674,597 | 10/1997 | Fujii et al. ................................. 428/212 |
| 5,759,444 | 6/1998 | Enokida et al. ..................... 252/301.16 |
| 5,811,833 | 9/1998 | Thompson ................................... 257/40 |
| 5,811,834 | 9/1998 | Tamano et al. ............................. 257/40 |

OTHER PUBLICATIONS

Concise Chemical and Technical Dictionary, 4th ed. (H. Bennett, editor), Chemical Publishing Co., Inc., pp. 1253, 1265 and 1271, 1986.

*Primary Examiner*—Marie Yamnitzky
*Attorney, Agent, or Firm*—E. O. Palazzo

[57] ABSTRACT

An organic electroluminescent (EL) device comprised, in the following sequence, of an anode, an organic hole injecting and hole transporting layer, an organic electron injecting and electron transporting layer, and a cathode, wherein said organic hole injecting and transporting layer is comprised of a mixture of a tertiary aromatic amine and a polycyclic aromatic hydrocarbon compound.

19 Claims, 1 Drawing Sheet

ORGANIC ELECTROLUMINESCENT DEVICES

PENDING APPLICATIONS AND PATENTS

In U.S. Pat. No. 5,763,110 and copending application U.S. Ser. No. 707,260, the disclosures of each application being totally incorporated herein by reference, there are illustrated EL devices.

Illustrated in copending applications U.S. Ser. No. 807,488 (now U.S. Pat. No. 5,846,666) is certain EL devices; U.S. Ser. No. 807,487 (now U.S. Pat. No. 5,747,205) relates to a process for the preparation of Starburst amines, and U.S. Ser. No. 807,510 (now U.S. Pat. No. 5,891,587) relates to photoconductive imaging members containing Starburst amines, each being filed concurrently herewith, and the disclosures of each application being totally incorporated herein by reference.

In a U.S. Pat. No. 5,674,635, the disclosure of which is totally incorporated herein by reference, there is illustrated an electroluminescent device comprised of a polymer of a tetraaryl-substituted biphenyidiamine, such as a copolymer of N,N'-diphenyl-N,N'-bis(3-hydroxyphenyl)-1,1'-biphenyl-4,4'-diamine with a component selected from the group consisting of bisphenyl-A-bischloroformate, ethyleneglycol bischloroformate, diethyleneglycol bischloroformate, adipoylchloride, suberoylchloride and sebacoylchloride, or a siloxane based N,N'-diphenyl-N,N'-bis(3-hydroxyphenyl)-1,1'-biphenyl-4,4'-diamine polymer. In this copending application, the hole transport polymers may be deposited by solution coating techniques, such as spin coating, dip coating, and spray coating, which may be disadvantageous, and moreover, thin films of amines of submicron thickness cannot be effectively prepared by vacuum deposition processes as they tend to decompose during the thermal heating processes. Furthermore, the synthesis and purification of polymeric hole transport materials can be tedious and labor intensive.

BACKGROUND OF THE INVENTION

This invention is directed to organic electroluminescent (EL) devices, and more specifically, to energy-efficient organic EL devices with enhanced operational stability and improved performance characteristics. Organic EL devices are believed to be capable of offering high luminescence at low driving voltages, excellent device stability, and extended life span. The organic EL devices of the present invention enable the aforementioned characteristics, and these EL devices can be selected for use in flat-panel emissive display technologies, including TV screens, computer screens, and the like, and as image bar components for digital copiers and printers.

PRIOR ART

A simple organic EL device is comprised of a layer of organic luminescent material conductively sandwiched between an anode, typically comprised of a transparent conductor such as indium-tin oxide and a cathode, typically a low work-function metal such as magnesium, calcium, aluminum, or the alloys thereof with other metals. The EL device functions on the principle that under an electric field, positive charges (holes) and negative charges (electrons) are respectively injected from the anode and cathode into the luminescent layer and undergo recombination to form excitonic states which subsequently emit light. Prior art organic EL devices have been constructed from a laminate of an organic luminescent material and electrodes of opposite polarity, which devices include a single crystal material, such as single crystal anthracence, as the luminescent substance as described, for example, in U.S. Pat. No. 3,530,325. However, these devices require excitation voltages on the order of 100 volts or greater. Subsequent modifications of the device structure through incorporation of additional layers, such as charge injecting and charge transport layers, have led to performance improvements. Illustrative examples of these type of EL devices have been disclosed in publications by Tang et al. in *J. Appl. Phys.* vol. 65, pp. 3610 to 3616 (1989) and Saito et al. in *Mol. Cryst. Liq. Cryst.* vol. 253, pp. 125 to 132 (1994), the disclosures of which are totally incorporated herein by reference.

An organic EL device can be fabricated with an organic dual layer structure comprising one layer adjacent to the anode supporting hole injection and transport, and another layer adjacent to the cathode supporting electron injection and transport. Another alternate device configuration is comprised of three separate layers, a hole transport layer, an emission layer, and an electron transport layer, which layers are laminated in sequence and are sandwiched as a whole between an anode and a cathode. Optionally, a fluorescent material can be added to the emission layer to induce recombination of charge carriers and emission of light within the fluorescent material, leading to improved luminescence efficiency.

While recent progress in organic EL research has elevated the potential of organic EL devices for widespread applications, their current performance characteristics need improvement and are less than expectation, except perhaps for the EL devices illustrated in the pending patent applications recited herein. Also, a number of the current organic EL devices possess relatively short operational lifetimes. These problems have been attributed to the deterioration of device material components, particularly the hole injecting and transporting layer with respect to its morphological instability as a thin film. This device degradation leads to a steady drop in luminance intensity and a progressive increase in operation voltage under an applied constant current. While certain hole transport materials such as aromatic tertiary amines are known to facilitate hole injection and hole transport and may lead to improved EL device performance, the thermal and morphological instability of some of these materials as thin films has led to shortened device serviceable life.

In U.S. Pat. No. 4,720,432, an EL device comprising a dual-layer hole injecting and transporting zone by inserting an additional layer formed of porphyrinic compounds between the anode and the tertiary aromatic amine layer is disclosed. However, the incorporation of a phorphyric layer causes it is believed a higher initial operation voltage in the current-voltage characteristic as compared to the device containing only a tertiary aromatic amine layer in the hole injecting and transporting zone. In addition, the intensely colored porphyrinic layer also partially blocks the light emission from the ITO glass side. In another approach disclosed in Japanese Patent Application Laid-Open No. 65958/1995, improved stability has been obtained by using a device configuration with a fluorescent dye-doped hole transport layer as the emitter. However, this device configuration requires the extension of the electron migration zone into the hole transport layer where the electron-hole recombination occurs with resultant light emission. Unfortunately, most organic electron transport materials commonly used in current EL devices, for example tris(8-hydroxyquinolinate) aluminum, possess relatively low electron carrier mobility, and thus their low efficiency in transporting electrons into the hole transport layer. Another disadvantage of this configuration is the limited availability of fluorescent materials suitable for doping the hole transport layer.

In view of the above-mentioned complexities and difficulties associated with current organic EL devices, extensive research in organic EL materials and device designs have been accomplished to attempt to arrive at an organic EL device design which has resolved many of the current EL performance disadvantages. In particular, with the present invention in embodiments there is provided an excellent device configuration comprising the incorporation of certain polycyclic aromatic hydrocarbon compounds into a tertiary aromatic amine hole transporting layer. This device configuration design has provided, for example, improved device operation stability without the accompanying degradation in the charge carrier injection and transport efficiencies.

SUMMARY OF THE INVENTION

It is accordingly an object of the present invention to provide organic EL devices with many of the advantages illustrated herein.

It is another object of the present invention to provide organic EL devices with enhanced thermal and operational stabilities, and thus significantly improved EL performance by incorporating certain polycyclic aromatic hydrocarbon compounds into the tertiary aromatic amine hole transporting layer.

Another object of the present invention is to provide organic EL devices with improved hole injection and transport characteristics; or wherein the hole transporting layer is doped with a polycyclic compound, such as rubrene, preferably about 5 weight percent.

In another object of the present invention there are provided improved organic EL devices which exhibit high electroluminescence efficiency at low operating voltages of below about 20 volts.

Further, in an object of the present invention there is provided an organic EL device comprised of a supporting substrate of, for example, glass, an anode, a vacuum deposited organic hole injecting and transporting zone comprised of aromatic tertiary amines and one or more polycyclic aromatic hydrocarbon compounds, a vacuum deposited electron injecting and transporting zone comprised of electron transport materials of, for example, tris(8-hydroxyquinolinate)aluminum, preferably doped with a fluorescent dye, such as quinacridone or its derivatives, and in contact therewith a low work function metal, such as magnesium, and its alloy or a lithium alloy as a cathode.

Embodiments of the present invention relate to the provision of layered organic EL devices which possess a number of advantages, such as improved operational stability, excellent durability, low operating voltages, and improved energy conversion efficiency, and which devices can be readily fabricated using vacuum deposition techniques. In embodiments, the present invention relates to organic EL devices comprised of, in sequence, an anode, an organic hole injecting and transporting zone, an electron injecting and transporting zone, and a cathode, wherein the hole injecting and transporting zone is comprised of a vacuum evaporated tertiary aromatic amine layer doped with certain polycyclic aromatic hydrocarbon compounds in effective amounts of, for example, from about 0.1 to about 50 weight percent, and preferably from about 1 to about 10 weight percent, and wherein the electron injecting and transporting zone is comprised of a vacuum evaporated electron transport layer of, for example, tris(8-hydroxyquinolinate)aluminum, preferably doped with a fluorescent dye such as quinacridone or its derivatives. The tertiary aromatic amines for the hole injecting and transporting zone may be selected, for example, from those compounds having a glass transition temperature of higher than about 50° C., and preferably higher than about 80° C. The thermal and mophological stability of the thin film hole transporting tertiary aromatic amine layer can be markedly improved by incorporation of an effective small amount of polycyclic aromatic hydrocarbon compounds without adversely affecting the hole injection and transport characteristics of the hole transport materials. Moreover, in embodiments, light emission of the organic EL devices of the present invention occurs in the electron transporting layer as a result of doping with a fluorescent dye which serves as an light emitter.

BRIEF DESCRIPTION OF THE FIGURE

Illustrated in FIGS. 1 and 2 are examples of EL devices of the present invention.

DESCRIPTION OF PREFERRED EMBODIMENTS

Figure 1:
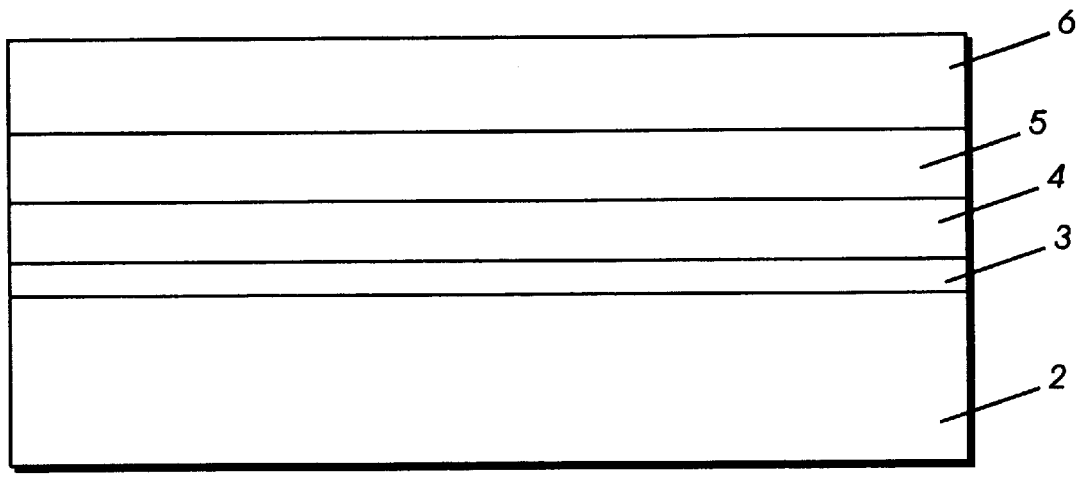

Embodiments of the present invention will be described in more detail with reference to FIG. 1. Illustrated in FIG. 1 is an EL device which comprises an organic light emitting diode comprised of a supporting substrate 2 of, for example, glass, an anode 3, a vacuum deposited organic hole injecting and transporting layer, or zone 4 of a tertiary aromatic amine layer incorporated with one or more polycyclic aromatic hydrocarbon compounds, a vacuum deposited electron injecting and transporting layer, or zone 5, preferably doped with a fluorescent material capable of emitting light subsequent to electron-hole recombination, and in contact therewith a low work function metal as a cathode 6.

Figure 2:
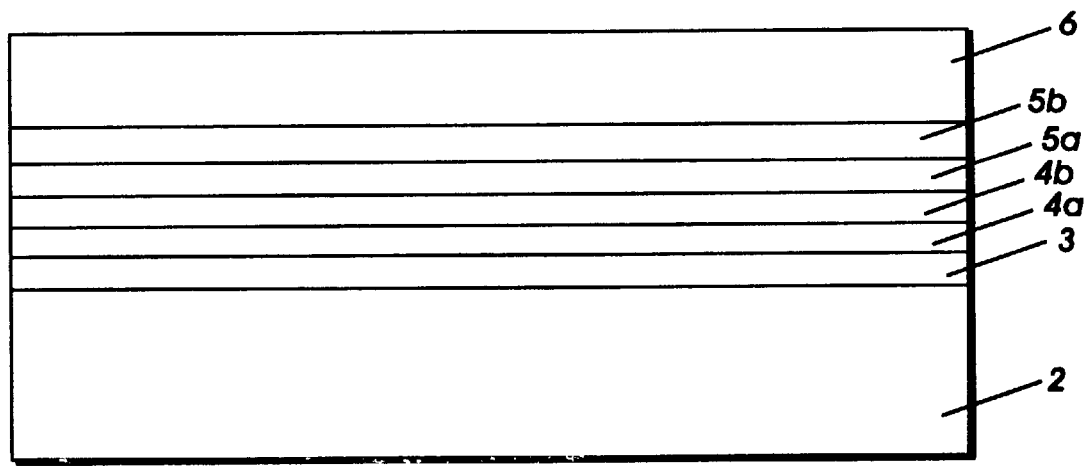

In embodiments, zone or layer 4 may function as a hole transport, a hole injector, or a combination thereof; and zone 5 or layer 5 may function as an electron transport, an electron injector, or a combination thereof. More specifically, the device may include two zones, reference FIG. 2, that is in place of 4, 4a and 4b, and in place of 5, 5a and 5b, wherein 4a is the hole injecting layer, 4b is the hole transport layer, 5a is electron transporting and 5b is electron injecting; 4a and 4b together with 5 alone, or 5a and 5b together with 4 alone.

Illustrative examples of supporting substrates include polymeric components, glass and the like, and polyesters like MYLAR®, polycarbonates, polyacrylates, polymethacrylates, polysulfones, quartz, and the like. Other substrates can be selected provided, for example, that they are essentially nonfunctional and can support the other layers. The thickness of the substrate can be, for example, from about 25 to over 1,000 microns, and more specifically, from about 100 to about 800 microns, depending, for example, on the structural demands of the device.

The anode in contact with the substrate in the devices of the present invention can be comprised of a metal, an alloy, an electroconducting compound or mixtures thereof, preferably with a work function equal to, or greater than about 4 electron volts, for example from 4 to about 7 electron volts. Specific examples of anodes include positive charge injecting electrodes such as indium tin oxide, tin oxide, zinc oxide, gold, platinum; electrically conductive carbon and π-conjugated polymers such as polyaniline, polypyrrole, and the like. The thickness of the anode can range from about 10 nanometers to 1 micron with the preferred range being dictated by the optical constants of the anode material. One preferred range of thickness is from about 10 to about 200 nanometers.

The hole injecting and hole transporting layer, or zone 4 is comprised of a hole transporting aromatic tertiary amine compound. The aromatic tertiary amines selected have a glass transition temperature equal to or higher than about 50° C. and preferably higher than about 80° C. (Centigrade). For example, triarylamine derivatives comprising one or more triarylamine structural units constitute a class of suitable hole transport aromatic tertiary amines. Illustrative examples of aromatic tertiary amines are those illustrated in U.S. Pat. No. 4,539,507, the disclosure of which is totally incorporated herein by reference, and are represented by the following formula:

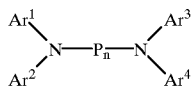

wherein $Ar^1$ to $Ar^4$ are aryl groups with, for example, from 6 to about 30 carbon atoms, and for example, independently selected from the group consisting of phenyl, tolyl, xylyl, naphthyl, 4-biphenylyl, and the like; P is an arylene, especially a phenylene group; and n is an integer of from 1 to 4. Specific examples include N,N'-diphenyl-N,N'-bis(3-methylphenyl)-1,1'-biphenyl-4,4'-diamine, N,N'-diphenyl-N,N'-bis(4-methylphenyl)-1,1'-biphenyl-4,4'-diamine, N,N,N',N'-tetra-p-tolyl-1,1'-biphenyl-4,4'-diamine, N,N'-di-1-naphthyl-N,N'-diphenyl-1,1'-biphenyl-4,4'-diamine, N,N'-di-2-naphthyl-N,N'-diphenyl-1,1'-biphenyl-4,4'-diamine, N,N'-di-1-naphthyl-N,N'-bis(3-methylphenyl)-1,1'-biphenyl-4,4'-diamine, N,N'-di-1-naphthyl-N,N'-bis(4-methylphenyl)-1,1'-biphenyl-4,4'-diamine, N,N'-di-4-biphenylyl-N,N'-diphenyl-1,1'-biphenyl-4,4'-diamine, N,N'-di-4-biphenylyl-N,N'-bis(4-methylphenyl)-1,1'-biphenyl-4,4'-diamine, and the like.

Examples of hole transport amine compounds for the hole injecting and hole transporting layer or zone can also be selected from the group of polynuclear aromatic amines as illustrated by the following formula, reference copending patent application U.S. Ser. No. 707,260, the disclosure of which is totally incorporated herein by reference.

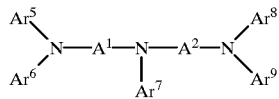

wherein $Ar^5$ to $Ar^9$ are aryl groups as illustrated herein and independently selected from, for example, phenyl, tolyl, xylyl, naphthyl, biphenylyl, and the like, and $A^1$ and $A^2$ are biaryl groups with, for example, from about 12 to about 60 carbon atoms, such as biphenyl, bitolyl, and the like.

Specific examples of the hole transport components include N,N-bis-[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, and the like.

The hole injecting and transporting layer, in addition to the aromatic amine compounds, preferably include polycarbocyclic aromatic compounds which serve to stabilize the thin film morphology of the hole transport layer. The effective amounts of the polycarbocyclic aromatic compounds may vary, for example, from about 0.1 to about 50 weight percent, and preferably from about 1 to about 10 weight percent. Suitable polycyclic aromatic hydrocarbon compound examples are those comprised of at least two aromatic rings and containing from about 10 to about 100 carbon atoms. Illustrative examples of polycarbocyclic aromatic hydrocarbon compounds are (1) rubrene, (2) 1,4,5,12-tetraphenylnaphthacene, (3) 1,4,5,8,9,10-hexaphenylanthracene, (4) 1,4,9,10-tetraphenylanthracene, (5) 9,10-diphenylanthracene, (6) 1,2,3,4-tetraphenylnaphthalene, (7) 2,3,6,7-tetraphenylnaphthalene, (8) 3,4-diphenylperylene, (9) 3,4-diphenylbenzo[k]perylene, (10) 3,4,9,10-tetraphenylperylene, (11) 2,7-diphenyidibenzo[e,l]pyrene, (12) dibenzo[e,l]pyrene, (13) benzo[c]naphtho[2,1-p]chrysene, (14) 2,3,6,11-tetraphenyltriphenylene, (15) dibenzo[a,h]anthracene, (16) 9,10-diphenyidibenzo[a,h]anthracene, (17) benzo[a]pyrene, (18) naphtho[b]pyrene, (19) 6,6,13,13-tetraphenyl-6,13-dihydropentacene, (20) 1,2,3,4,5-pentaphenyl-1,3-cyclopentadiene, (21) hexaphenylbenzene, (22) 2,2',7,7'-tetraphenyl-9,9'-spirobifluorene, (23) p-quinquephenyl, (24) coronene, (25) pentacene, or (26) 6,13-diphenylpentacene and the like. These compounds may also contain one or more substituents such as alkyl groups with 1 to about 8 carbon atoms, halogen, alkoxy, aryloxy, amino, dialkylamino, or diarylamono, and the like.

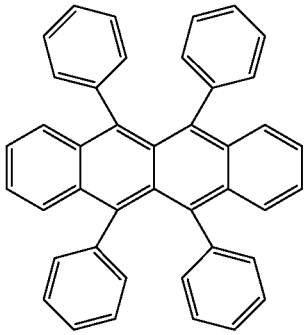

(1)

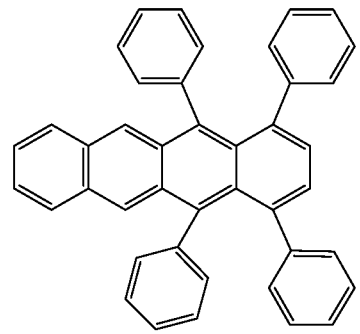

(2)

(3)
(4)
(5)
(6)
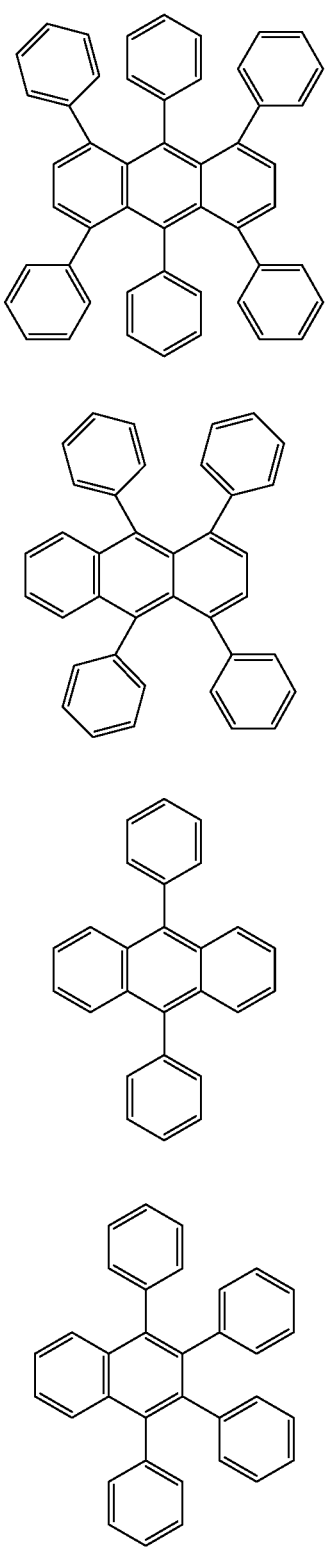
(7)
(8)
(9)
(10)
(11)
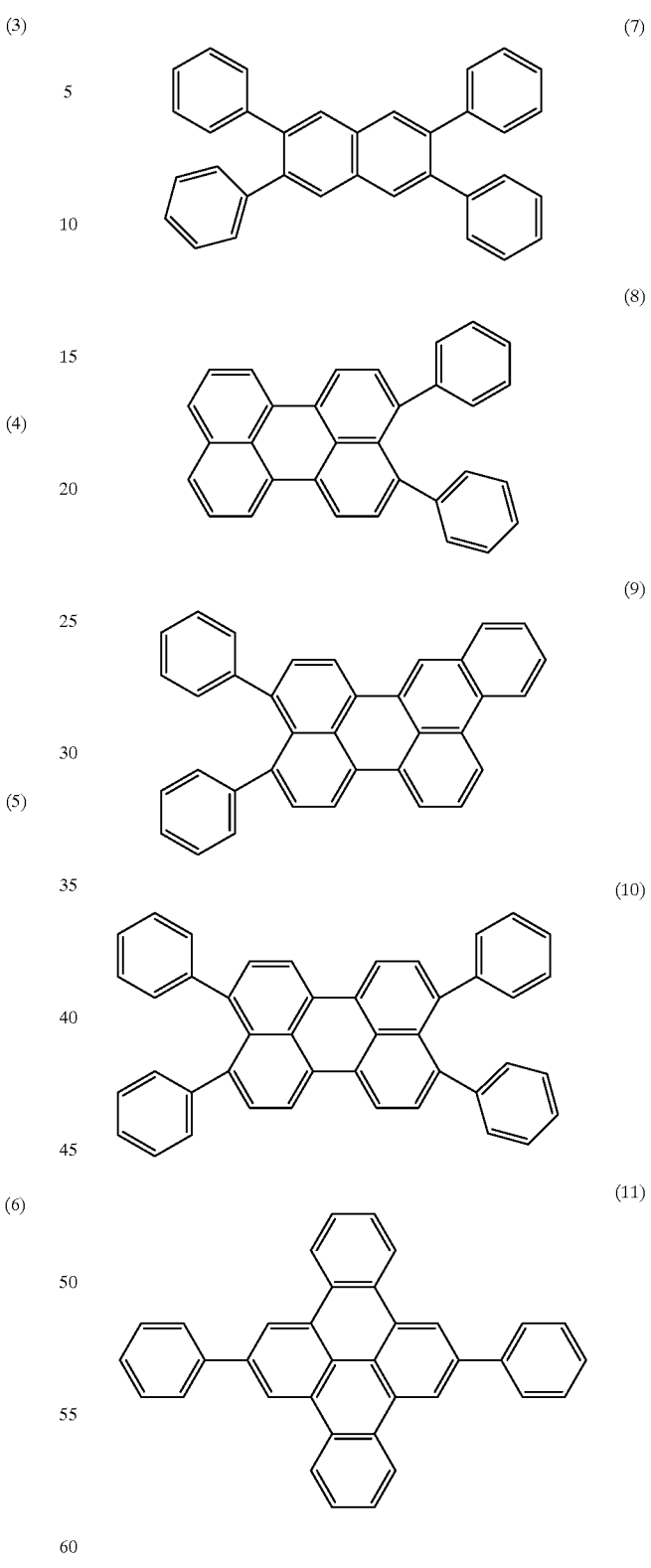

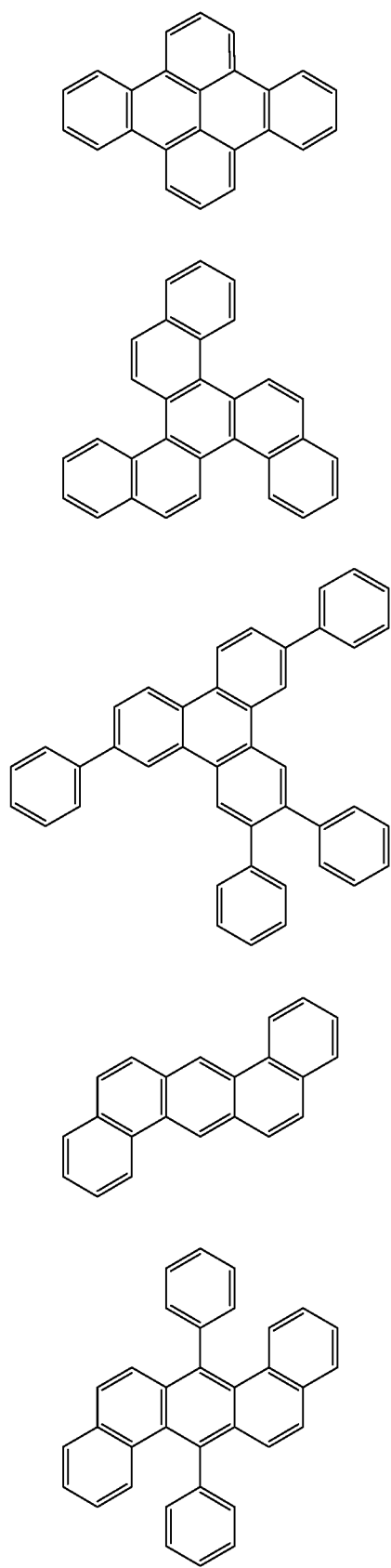
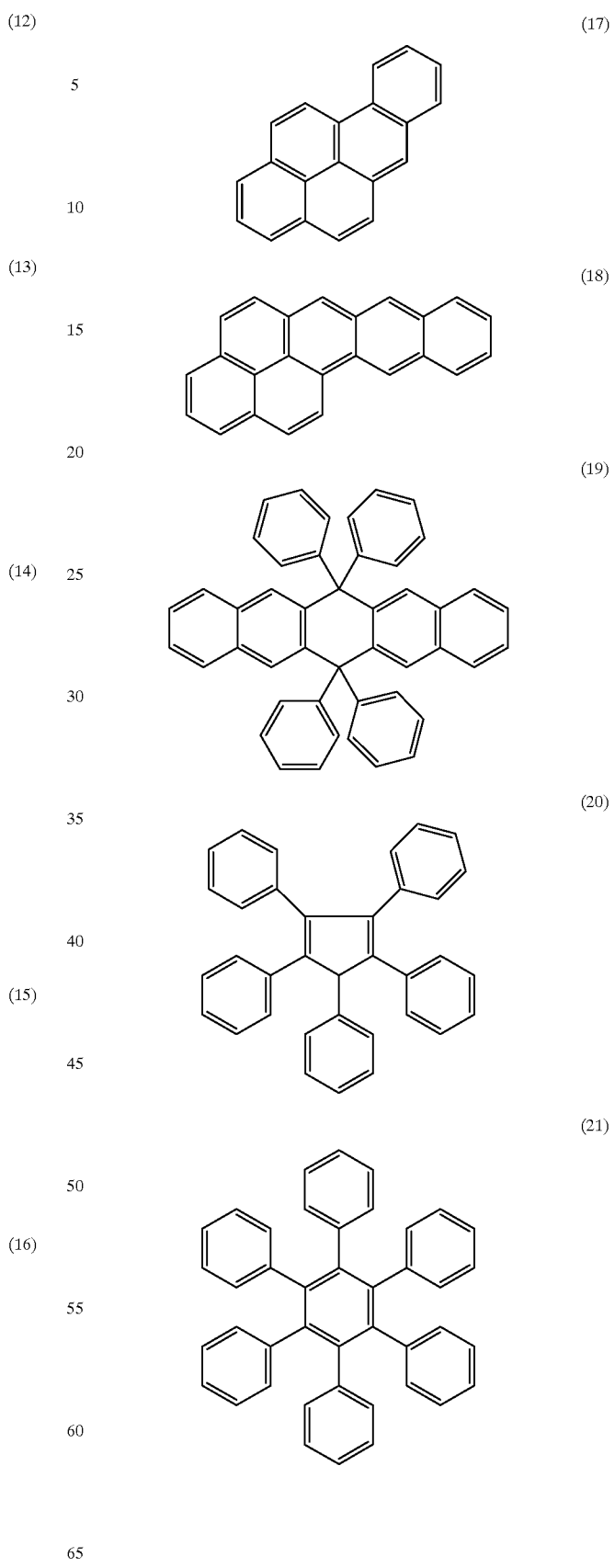

(22)

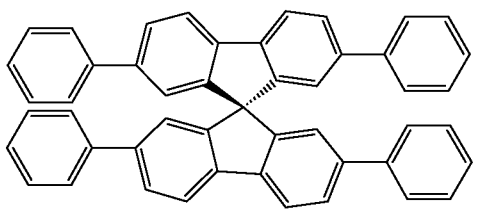

(23)

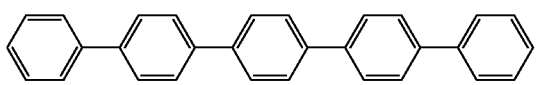

(24)

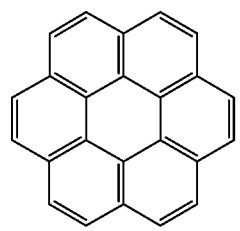

(25)

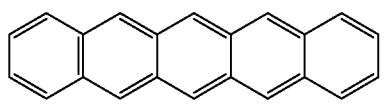

(26)

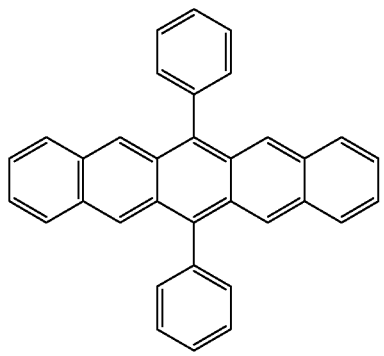

The electron injecting and transporting layer or zone in the EL devices of the present invention can be fabricated from a number of electron injecting and transporting compounds. Examples of useful electron transport compounds include fused ring luminescent materials such as anthracene, phenanthracene, pyrene, perylene, and the like as illustrated in U.S. Pat. No. 3,172,862, the disclosure of which is totally incorporated herein by reference; butadienes such as 1,4-diphenylbutadiene and tetraphenylbutadiene, stilbenes, and the like as illustrated in U.S. Pat. Nos. 4,356,429 and 5,516,577, the disclosures of which are totally incorporated herein by reference; and optical brightness such as those disclosed by U.S. Pat. No. 4,539,507, the disclosure of which is totally incorporated herein by reference, and the like.

Particularly preferred electron transport materials are metal chelates of 8-hydroxyquinoline disclosed in U.S. Pat. Nos. 4,539,507; 5,151,629, and 5,150,006, the disclosures of which are totally incorporated herein by reference. Illustrative examples of the metal chelated compounds include tris(8-hydroxyquinolinate)aluminum (AlQ3), tris(8-hydroxyquinolinate)gallium, bis(8-hydroxyquinolinate) magnesium, bis(8-hydroxyquinolinate)zinc, tris(5-methyl-8-hydroxyquinolinate)aluminum, tris(7-propyl-8-quinolinolato)aluminum, bis[benzo{f}-8-quinolinate]zinc, bis(10-hydroxybenzo[h]quinolinate)beryllium, bis(2-methylquinolinolato) aluminum(III)-$\mu$-oxo-bis(2-methyl-8-quinolinolato)aluminum(III), bis(2-methyl-8-quinolinolato) (phenolato)aluminum, bis(2-methyl-8-quinolinolato)(para-phenylphenolato)aluminum, bis(2-methyl-8-quinolinolato) (2-naphthalolato)aluminum, and the like.

Another class of preferred electron injecting and transporting compounds are metal thioxinoid compounds, such as disclosed in copending patent application U.S. Ser. No. 807,488 (U.S. Pat. No. 5,846,666), the disclosure of which is totally incorporated herein by reference. Illustrative examples of useful metal thioxinoide compounds include bis(8-quinolinethiolato)zinc, bis(8-quinolinethiolato) cadmium, tris(8-quinolinethiolato)gallium, tris(8-quinolinethiolato)indium, bis(5-methylquinolinethiolato) zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like.

In the organic EL devices of the present invention, light emission is primarily controlled in the electron transport layer preferably containing a doped fluorescent dye which serves to emit light subsequent to the occurrence of electron-hole recombination in the electron injecting and transport zone. The fluorescent dye is present in the electron injecting and transporting zone in an effective amount of 0.01 to about 10 weight percent, and preferably from about 0.5 to about 5 weight percent. Useful fluorescent materials include those which are compatible with the host electron transporting materials, and can readily form a stable common phase with the host materials. Illustrative examples of fluorescent dyes include those as disclosed in U.S. Pat. No. 4,769,292, the disclosure of which is totally incorporated herein by reference, coumarin dyes such as 7-diethylamino-4-methylcoumarin, 4,6-dimethyl-7-ethylaminocoumarin, 4-methyl umbelliferone, and the like; fluorescent 4-dicyanomethylene-4H-pyrans such as 4-(dicyanomethylene)-2-methyl-6-(p-dimethylaminostyryl)-4H-pyran, and the like; polymethine dyes such as cyanines, merocyanines, complex cyanines and merocyanines, oxonals, hexioxonols, styryls, merostyryls, streptocyanines, and the like; oxobenzanthracene dyes; xanthene dyes including rhodamine dyes such as [9-(o-carboxyphenyl)-6-(diethylamino)-3H-xanthen-3-yildene] diethyl ammonium, sulforhodamine B and the like; and aromatic fused ring fluorescent dyes such as rubrene, coronene, and the like.

A particularly preferred class of fluorescent materials for the organic EL devices of the present invention are quinacridone dyes. Illustrative examples of quinacridone dyes that can be selected include quinacridone, 2-methylquinacridone, 2,9-dimethylquinacridone, 2-chloroquinacridone, 2-fluoroquinacridone, 1,2-benzoquiacridone, N,N'-dimethylquinacridone, N,N'-dimethyl-2-methylquinacridone, N,N'-dimethyl-2,9-dimethylquinacridone, N,N'-dimethyl-2-chloroquinacridone, N,N'-dimethyl-2-fluoroquinacridone, N,N'-dimethyl-1,2-benzoquinacridone, N,N'-diethylquinacridone, N,N'-dipropylquinacridone, N,N'-diiso-propylquinacridone, N,N'-di-n-butylquinacridone, N,N'-di-t-butylquinacridone, N,N'-dimethylquinacridone, N,N'-diphenylquinacridone, and the like.

In embodiments of the present invention, the total thickness of the organic luminescent medium, which includes the hole injecting and transporting zone 4 and the electron injecting and transporting zone 5, is preferably limited to less than about 1 micron to maintain a current density compatible with an efficient light emission under a relatively low voltage applied across the electrodes. Suitable thickness of the hole injecting and transporting zone can range from about 50 to about 2,000 Å, preferably from about 400 to about 1,000 Å. Similarly, the thickness of the electron injecting and transporting zone can range from about 50 to about 2,000 Å, and preferably from about 400 to about 1,000 Å.

The cathode 6 can be comprised of any suitable metal, including high or low work function metals. The cathode which can be derived from a combination of a low work function metal (less than or equal to about 4 eV, for example from 2 to about 4) and a second metal can provide additional advantages such as improved device performance and stability. Suitable proportions of the low work function metal to the second metal may range from less than about 0.1 percent to about 99.9 percent by weight. Illustrative examples of low work function metals include alkaline metals, Group 2A or alkaline earth metals, and Group III metals including rare earth metals and the actinide group metals. Lithium, magnesium and calcium are particularly preferred.

The thickness of cathode 6 ranges from, for example, about 10 to about 5,000 Å. The Mg:Ag cathodes of U.S. Pat. No. 4,885,211 constitute one preferred cathode construction. Another preferred cathode construction is described in U.S. Pat. No. 5,429,884, wherein the cathodes are formed from lithium alloys with other high work function metals such as aluminum and indium. The disclosures of each of the above two patents are totally incorporated herein by reference.

Both anode 3 and cathode 6 of the organic EL devices of the present invention can be of any convenient forms. A thin conductive layer can be coated onto a light transmissive substrate, for example a transparent or substantially transparent glass plate or plastic film. The EL device can include a light transmissive anode 3 formed from tin oxide or indium tin oxide coated on a glass plate. Also, very thin, for example less than or equal to about 200 Å (Angstroms), and more specifically, from about 100 to about 200 Angstroms, light-transparent metallic anodes can be used, such as gold, palladium, and the like. In addition, transparent or semi-transparent very thin layers of conductive carbon or conjugated polymers, such as polyaniline, polypyrrole, and the like, can be used as anodes. Any light transmissive polymeric film can be employed as the substrate. Further, suitable forms of the anode 3 and cathode 6 are illustrated in U.S. Pat. No. 4,885,211, the disclosure of which is totally incorporated herein by reference.

The following Examples are provided to further define various aspects of the present invention, it being noted that these Examples are intended to illustrate and not limit the scope of the present invention.

EXAMPLE I

An organic EL device was prepared in the following manner:

1. An indium tin oxide, 500 Å in thickness, (ITO) coated glass (1 millimeter in thickness) was cleaned with a commercial detergent, rinsed with deionized water, and dried in oven at 60° C. for 1 hour. Immediately before use, the glass was treated with UV ozone for 0.5 hour.

2. The ITO substrate was placed in a vacuum deposition chamber. Under a pressure of less than about $5 \times 10^{-6}$ Torr, the hole transport compound, N,N'-di-1-naphthyl-N,N'-diphenyl-1,1'-biphenyl-4,4'-diamine, and rubrene were simultaneously evaporated from two electrically heated tantalum boats to deposit a 60 nanometer thick layer on the ITO glass. The deposition rates of the hole transport compound and rubrene were controlled at 0.6 nanometer/second and 0.03 nanometer/second, respectively, by means of an Inficon Model IC/5 controller.

3. Onto the hole injection and transport layer of 2 was deposited a 60 nanometer electron injecting and transporting layer by simultaneously evaporating the electron transport compound, tris(8-hydroxyquinolinate)aluminum, and a fluorescent dye, N,N'-dimethyl-2,9-dimethylquinacridone, from two electrically heated tantalum boats at an evaporation rate of 0.6 nanometer/second and 0.09 nanometer/second, respectively.

4. A 100 nanometer magnesium silver alloy was deposited at a total deposition rate of 1 nanometer/second onto the electron injecting and transporting layer of 3 by simultaneously evaporating from two independently controlled tantalum boats, one containing Mg, and the other one Ag. The typical composition was 9:1 in atomic ratio of Mg to Ag. Finally, a 200 nanometer silver layer was overcoated on the Mg:Ag cathode for the purpose of protecting the reactive Mg from ambient moisture.

The device as prepared above was retained in a dry box which was continuously purged with nitrogen gas. The device performance was assessed by measuring its current-voltage characteristics and light output under a direct current measurement. The current-voltage characteristics were determined with a Keithley Model 238 High Current Source Measure Unit. The ITO electrode was always connected to the positive terminal of the current source. At the same time, the light output from the device was monitored by a silicon photodiode.

In operation, when a positive bias voltage was applied to the ITO electrode, the prepared device emitted yellowish green light with a peak emission at 550 nanometers. The emission spectrum recorded from this device was identical to the electroluminescent spectrum of N,N'-dimethyl-2,9-dimethylquinacridone, indicating that the light of the present EL device was emitted from the quinacridone fluorescent dye present in the electron injecting and transporting layer.

The operational stability of the device was tested under a constant current density of 25 mA/cm$^2$. The initial light intensity was 1,000 cd/m$^2$, an intensity level that is in excess of that required for practical application. The light intensity decreased slowly over time, and a 50 percent reduction in light intensity was recorded after 1,500 hours of continuous operation.

COMPARATIVE EXAMPLE 1

A controlled EL device was prepared in the same manner as that of Example I except that the hole transport layer of N,N'-di-1-naphthyl-N,N'-diphenyl-1,1'-biphenyl-4,4'-diamine was deposited without rubrene.

When a positive bias voltage was applied to the ITO electrode, this device emitted yellowish green light with a peak emission at 550 nanometers. The emission spectrum recorded from this device was identical to the electroluminescent spectrum of N,N'-dimethyl-2,9-dimethylquinacridone, indicating that the light of the present EL device was emitted from the quinacridone fluorescent dye doped in the electron transporting layer. The operational stability of the device was tested under a constant current density of 25 mA/cm$^2$. The initial light intensity was 1,000 cd/m$^2$. The light intensity decreased to 50 percent of its initial light intensity after only 200 hours of continuous operation. This result indicates that the EL device with a nonstabilized hole transport layer had poorer operation stability.

COMPARATIVE EXAMPLE 2

A controlled EL device was constructed using a modification of the procedure described in Example I. In step 2, N,N'-dimethyl-2,9-dimethylquinacridone was utilized in place of rubrene to form the hole transport layer. The electron transport layer was formed from tris(8-hydroxyquinolinate)aluminum without the dopant quinacridone dye.

When a positive bias voltage was applied to the ITO electrode, this device emitted green light with a peak emission at 525 nanometers. The emission spectrum recorded from this device was identical to the electroluminescent spectrum of tris(8-hydroxyquinolinate)aluminum, indicating that the light was not emitted from the quinacridone fluorescent dye present in the hole transport layer. The operational stability of the device was tested under a constant current density of 12.5 mA/cm$^2$. The initial light intensity was 185 cd/m$^2$. The light intensity decreased to 50 percent of its initial light intensity after 600 hours of continuous operation. This Example demonstrates that the quinacridone fluorescent dye may not be suitable as a light emitting dopant in the hole transport layer.

COMPARATIVE EXAMPLE 3

An organic EL device was constructed in accordance with Example I except that the tris(8-hydroxyquinolinate) aluminum layer was deposited without N,N'-dimethyl-2,9-dimethylquinacridone.

When a positive bias voltage was applied to the ITO electrode, the device emitted yellowish green light with a peak emission at 550 nanometers. The emission spectrum recorded from this device was identical to the electroluminescent spectrum of rubrene, indicating that the light of the present EL device was emitted from the rubrene fluorescent dye doped in the hole transport layer. The operational stability of the device was tested under a constant current density of 25 mA/cm$^2$. The initial light intensity was 1,000 cd/m$^2$, an intensity level that is in excess of that required for practical application. The light intensity decreased slowly over time, and a 50 percent reduction in light intensity was recorded after only 130 hours of continuous operation.

EXAMPLE II

An organic EL device was prepared in accordance with the procedure of Example I except that N,N'-dimethylquinacridone was utilized as a fluorescent dye in place of N,N'-dimethyl-2,9-dimethylquinacridone.

When a positive bias voltage was applied to the ITO electrode, the device emitted green light with a peak emission at 540 nanometers. The emission spectrum recorded from this device was identical to the electroluminescent spectrum of N,N'-dimethyl-quinacridone, indicating that the light of the present device was emitted from the quinacridone fluorescent dye present in the electron transport layer. The operational stability of the device was tested under a constant current density of 25 mA/cm$^2$. The initial light intensity was 800 cd/m$^2$. The light intensity decreased slowly over time, and a 50 percent reduction in light intensity was recorded after 1,200 hours of continuous operation.

EXAMPLE III

An organic EL device was constructed in accordance with the procedure of Example I except that 1,2,3,4-tetraphenylnaphthalene was utilized in place of rubrene.

When a positive bias voltage was applied to the ITO electrode, the present device emitted green light with a peak emission at 540 nanometers. The emission spectrum recorded from this device was identical to the electroluminescent spectrum of N,N'-dimethylquinacridone, indicating that the light was emitted from the quinacridone fluorescent dye doped in the electron transport layer. The operational stability of the device was tested under a constant current density of 25 mA/cm$^2$. The initial light intensity was 850 cd/m$^2$, an intensity level that is well in excess of that required for practical application. The light intensity decreased slowly over time, and a 50 percent reduction in light intensity was recorded after 950 hours of continuous operation.

EXAMPLE IV

An organic EL device was constructed in accordance with the procedure of Example I except that 1,2,3,4-tetraphenylnaphthalene and bis(8-quinolinethiolato)zinc were utilized in place of rubrene and tris(8-hydroxyquinolinate)aluminum, respectively.

When a positive bias voltage was applied to the ITO electrode, the device emitted yellowish green light with a peak emission at 550 nanometers. The emission spectrum recorded from this device was identical to the electroluminescent spectrum of N,N'-dimethyl-2,9-dimethylquinacridone, indicating that the light was emitted from the quinacridone fluorescent dye doped in the electron transport layer. The operational stability of the device was tested under a constant current density of 25 mA/cm$^2$. The initial light intensity was 950 cd/m$^2$, an intensity level that is well in excess of that required for practical application. The light intensity decreased slowly over time, and a 50 percent reduction in light intensity was recorded after 850 hours of continuous operation.

EXAMPLE V

An organic EL device was constructed in accordance with the procedure of Example I except that N,N-bis-[4'-(N-phenyl-N-m-tolylamino)-4-biphenylyl]aniline was utilized in place of N,N'-di-1-naphthyl-N,N'-diphenyl-1,1'-biphenyl-4,4'-diamine as the hole transport component.

When a positive bias voltage was applied to the ITO electrode, the present device emitted green light with a peak emission at 540 nanometers. The emission spectrum recorded from this device was identical to the electroluminescent spectrum of N,N'-dimethylquinacridone, indicating that the light was emitted from the quinacridone fluorescent dye doped in the electron transport layer. The operational stability of the device was tested under a constant current density of 25 mA/cm$^2$. The initial light intensity was 1,150 cd/m$^2$, an intensity level that is in excess of that required for practical application. The light intensity decreased slowly over time, and a 50 percent reduction in light intensity was recorded after 950 hours of continuous operation.

Other embodiments and modifications of the present invention may occur to those of ordinary skill in the art subsequent to a review of the present application and the information presented herein; these embodiments and modifications, as well as equivalents thereof, are also included within the scope of this invention.

What is claimed is:

1. An organic electroluminescent (EL) device comprised, in the following sequence, of an anode, an organic hole injecting and hole transporting layer, an organic electron injecting and electron transporting layer, and a cathode, wherein said organic hole injecting and transporting layer is comprised of a mixture of a tertiary aromatic amine and a polycyclic aromatic hydrocarbon compound, and wherein said polycyclic aromatic compound is comprised of at least 2 aromatic rings and contains from about 10 to about 100 carbon atoms, and wherein said polycyclic aromatic hydrocarbon contains one or more substituents of an alkyl group having 1 to 8 carbon atoms, halogen, alkoxy, aryloxy, amino, dialkylamino, or diarylamino and wherein said polycyclic aromatic compound is selected from 1,4,5,12-tetraphenylnaphthacene, 1,4,5,8,9,10-hexaphenylanthracene, 1,4,9,10-tetraphenylanthracene, 9,10-diphenylanthracene, 1,2,3,4-tetraphenylnapthalene, 2,3,6,7-tetraphenylnaphthalene, 3,4-diphenylperylene, 3,4-diphenylbenzo[k]perylene, 3,4,9,10-tetraphenylperylene, 2,7-diphenyldibenzo[e,l]pyrene, dibenzo[e,l]pyrene, benzo[c]naphtho[2,1-p]chrysene, 2,3,6,11-tetraphenyltriphenylene, dibenzo[a,h]anthracene, 9,10-diphenyldibenzo[a,h]anthracene, benzo[a]pyrene, naphtho[b]pyrene, 6,6,13,13-tetraphenyl-6,13-dihydropentacene, hexaphenylbenzene, 2,2',7,7'-tetraphenyl-9,9'-spirobifluorene, p-quinquephenyl, coronene, pentacene, and 6,13-diphenylpentacene, and wherein said organic electron injecting and transporting layer is comprised of a luminescent layer comprised of an electron transporting component, and wherein the luminescent layer is doped with a fluorescent dye.

2. An organic EL device in accordance with claim 1 wherein said fluorescent dye has a band gap of less than or equal to that of said electron transporting component, and a reduction potential which is less negative than that of said electron transport component.

3. An organic EL device in accordance with claim 1 wherein said tertiary aromatic amine is represented by the following formula

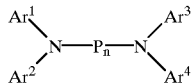

wherein $Ar^1$ to $Ar^4$ are aryl independently selected from the group consisting of phenyl, naphthyl, and 4-biphenylyl; P is a phenylene group; and n is an integer of from 1 to 4.

4. An organic EL device in accordance with claim 1 wherein said tertiary aromatic amine is selected from the group consisting of N,N'-diphenyl-N,N'-bis(3-methylphenyl)-1,1'-biphenyl-4,4'-diamine, N,N'-diphenyl-N,N'-bis(4-methylphenyl)-1,1'-biphenyl-4,4'-diamine, N,N,N',N'-tetra-p-tolyl-1,1'-biphenyl-4,4'-diamine, N,N'-di-naphthyl-N,N'-diphenyl-1,1'-biphenyl-4,4'-diamine, N,N'-di-2-naphthyl-N,N'-diphenyl-1,1'-biphenyl-4,4'-diamine, N,N'-di-1-naphthyl-N,N'-bis(3-methylphenyl)-1,1'-biphenyl-4,4'-diamine, N,N'-di-1-naphthyl-N,N'-bis(4-methylphenyl)-1,1'-biphenyl-4,4'-diamine, N,N'-di-4-biphenylyl-N,N'-diphenyl-1,1'-biphenyl-4,4'-diamine, and N,N'-di-4-biphenylyl-N,N'-bis(4-methylphenyl)-1,1'-biphenyl-4,4'-diamine.

5. An organic electroluminescent (EL) device in accordance with claim 1 wherein said tertiary amine is comprised of polynuclear arylamines represented by the formula

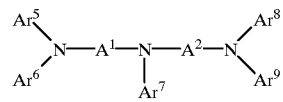

wherein $Ar^5$ to $Ar^9$ are aryl groups independently selected from phenyl, tolyl, xylyl, naphthyl, or biphenylyl, and $A^1$ and $A^2$ are biaryl groups of biphenyl, or bitolyl.

6. An organic EL device in accordance with claim 1 wherein said tertiary aromatic amine is selected from the group consisting of N,N-bis-[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; and N,N-bis-[4'-(N-phenyl-N-m-tolylamino)-4-biphenylyl]-m-aminonaphthalene.

7. An organic EL device in accordance with claim 1 wherein said tertiary aromatic amine is N,N'-di-1-naphthyl-N,N'-diphenyl-1,1'-biphenyl-4,4'-diamine.

8. An organic EL device in accordance with claim 1 wherein said electron transport component is comprised of a stilbene or an oxadiazole.

9. An organic EL device in accordance with claim 1 wherein said electron transport component is comprised of a metal chelated compound of 8-hydroxyquinoline.

10. An organic EL device in accordance with claim 1 wherein said electron transport component is comprised of a metal thioxinoid compound.

11. An organic EL device in accordance with claim 1 wherein said fluorescent dye is selected from the group consisting of coumarin, dicyanomethylenepyranes, polymethine, oxabenzanthrane, xanthene, pyrylium, carbostyl, and fused ring aromatic fluorescent dye components.

12. An organic EL device in accordance with claim 1 wherein said fluorescent dye is a quinacridone dye selected from the group consisting of 2-methylquinacridone, 2,9-dimethylquinacridone, 2-chloroquinacridone, 2-fluoroquinacridone, 1,2-benzoquinacridone, N,N'-dimethylquinacridone, N,N'-dimethyl-2-methylquinacridone, N,N'-dimethyl-2,9-dimethylquinacridone, N,N'-dimethyl-2-chloroquinacridone, N,N'-dimethyl-2-fluoroquinacridone, N,N'-dimethyl-1,2-benzoquinacridone, N,N'-diethylquinacridone, N,N'-dipropylquinacridone, N,N'-di-iso-propylquinacridone, N,N'-di-n-butylquinacridone, N,N'-di-t-butylquinacridone, N,N'-dimethylquinacridone, and N,N'-diphenyl quinacridone.

13. An organic EL device in accordance with claim 1 wherein said fluorescent dye is present in a concentration of from about $10^{-3}$ to about 10 mole percent of said electron transporting component.

14. An organic EL device in accordance with claim 1 wherein the anode is comprised of indium tin oxide, conductive carbon, a conductive polymer of polypyrrole, or polyaniline, and the cathode is comprised of a metal.

15. An organic EL device in accordance with claim 1 wherein the cathode is comprised of a mixture of a low work function metal with a value of less than about 4 eV, and a second metal, which second metal possesses a high or low work function.

16. An organic EL device in accordance with claim 15 wherein said low work function metal is selected from the group consisting of alkaline metal, alkaline earth metal, rare earth metal, and Group III metals.

17. An organic EL device in accordance with claim 1 wherein the cathode is comprised of a magnesium-silver alloy, or a lithium-aluminum alloy.

18. An organic EL device in accordance with claim 1 wherein the anode is of a thickness of from about 10 to about 500 nanometers, the hole injecting and transporting layer is of a thickness of from about 5 to about 200 nanometers, the electron injecting and transporting layer is of a thickness from about 5 to about 200 nanometers, and the cathode is of a thickness from about 5 nanometers to about 5 micrometers.

19. An organic electroluminescent (EL) device in accordance with claim 1 wherein said tertiary amine is comprised of polynuclear arylamines represented by the formula

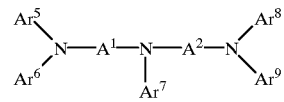

wherein $Ar^5$ to $Ar^9$ are aryl, and $A^1$ and $A^2$ are biaryl.

* * * * *